United States Patent [19]
Motohashi et al.

[11] Patent Number: 5,748,131
[45] Date of Patent: May 5, 1998

[54] A/D CONVERTING CIRCUIT

[75] Inventors: Kazunori Motohashi; Guoliang Shou; Makoto Yamamoto; Sunao Takatori, all of Tokyo, Japan

[73] Assignees: Sharp Kabushiki Kaisha, Osaka; Yozan, Inc., Tokyo, both of Japan

[21] Appl. No.: 710,307

[22] Filed: Sep. 17, 1996

[30] Foreign Application Priority Data

Sep. 18, 1995 [JP] Japan ................... 7-263574

[51] Int. Cl.$^6$ .............................. H03M 1/12
[52] U.S. Cl. ............................... 341/155
[58] Field of Search ..................... 341/155, 200, 341/136, 131, 166

[56] References Cited

U.S. PATENT DOCUMENTS 4,197,472  4/1980  Aoki et al. ................ 307/355

FOREIGN PATENT DOCUMENTS 7-273651  10/1995  Japan .
8-102673   4/1996  Japan .

*Primary Examiner*—Brian K. Young
*Attorney, Agent, or Firm*—Cushman, Darby & Cushman IP Group of Pillsbury, Madison & Sutro LLP

[57] ABSTRACT

The present invention has an object to provide an A/D converting circuit with improved accuracy in an output. In this invention, the initial electric charge is given to a capacitive coupling for outputting in a quantizing circuit so as to cancel the dispersion of thresholds of MOS inverter in the quantizing circuit, the supply voltage of the first and the second inverters is higher than the supply voltage of an inverter for quantizing, as well as the initial electric charge is given to a capacitance for input in order to limit the function of the quantizing circuit within the linear area of the first and the second inverters.

2 Claims, 2 Drawing Sheets

A/D CONVERTING CIRCUIT

FIELD OF THE INVENTION

The present invention relates to an A/D converting circuit having;

i) a first capacitance to which an analog input voltage is inputted;

ii) a first MOS inverter circuit connected to an output of the first capacitance, with linear relationship between input and output;

iii) a first quantizing circuit to which the analog input voltage is inputted for outputting an quantized output of the analog input voltage, the first quantizing circuits comprising a plurality of stages of thresholding circuits each of which comprises a MOS inverter for quantizing having a predetermined threshold and a capacitive coupling for quantizing having a plurality of parallel capacitances connected to an input of the MOS inverter for quantizing, the capacitive coupling for quantizing receiving the input voltage and inverted output of upper thresholding circuits, the MOS inverter for quantizing in each thresholding circuits inverting an output of the capacitive coupling for quantizing when the output exceeds the threshold, iv) a capacitive coupling for output to which outputs of the first MOS inverter and of the first quantizing circuit are inputted;

v) a second MOS inverter circuit inputted to which an output of the capacitive coupling for output in inputted, with substantially the same characteristics as the first MOS inverter circuit; and vi) a second quantizing circuit an output of the second MOS inverter is inputted for quantizing the output of the second MOS inverter, the second quantizing circuits comprising a plurality of stages of thresholding circuits each of which comprises a MOS inverter for quantizing having a predetermined threshold, and a capacitive coupling for quantizing having a plurality of parallel capacitances connected to an input of the MOS inverter for quantizing, the capacitive coupling for quantizing receiving the input voltage and inverted output of upper thresholding circuits, the MOS inverter for quantizing in each thresholding circuits inverting an output of the capacitive coupling for quantizing when the output exceeds the threshold.

BACKGROUND OF THE INVENTION

The applicants filed a patent application of A/D converting circuit of the same kind of the present invention of Japanese application number 6-261613. An A/D converting circuit of high accuracy in conversion no matter how the accuracy of a capacitance is. However, there is a dispersion in threshold of MOS inverters of the A/D converting circuit.

SUMMARY OF THE INVENTION

The present invention solves the above conventional problems and has an object to provide an A/D converting circuit with improved accuracy in an output.

In an A/D converting circuit according to the present invention, the initial electric charge is given to a capacitive coupling for outputting in a quantizing circuit so as to cancel the dispersion of thresholds of MOS inverter in the quantizing circuit, the supply voltage of the first and the second inverters is higher than the supply voltage of an inverter for quantizing, as well as the initial electric charge is given to a capacitance for input in order to limit the function of the quantizing circuit within the linear area of the first and the second inverters.

According to the present invention, it is possible to cancel the influence of dispersion of threshold of an inverter, and also possible to improve the linearity of the inverter. Consequently, the accuracy of an output can be improved.

PREFERRED EMBODIMENT OF THE PRESENT INVENTION

Hereinafter, the first embodiment of an A/D converting circuit according to the present invention is described with reference to the attached drawings.

Figure 1:
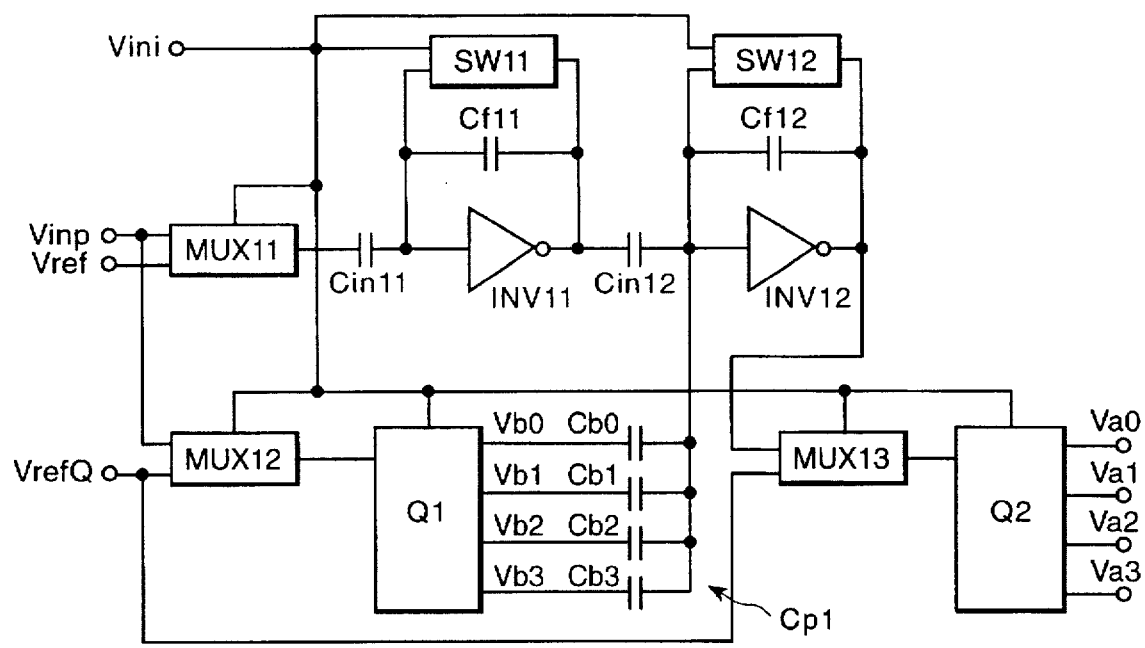
FIG. 1 shows the first embodiment of an A/D converting circuit according to the present invention.

In FIG. 1, A/D converting circuit includes two serial stages of inverters INV11 and INV12 outputs of which are connected through feedback capacitances Cf11 and Cf12 to their inputs, respectively. An input capacitance Cin1 is connected to the input terminal of INV11, and an analog input voltage Vinp is inputted to a capacitance Cin11. An input capacitance Cin12 is connected to the input terminal of INV12, and the output of INV11 is connected to INV12 through a capacitance Cin12.

Each of INV11 and INV12 includes three stages of MOS inverters, and has a large gain obtained by a multiplication of open-gains of three steps of inverters. Consequently INV11 generates an output V1 below with good linearity, which output is determined by a ratio of the input capacitance and the feedback capacitance.

$$V1 - Vdd[AMP] = -\frac{Cin11}{Cf11} Vinp \quad (1)$$

Here, Vdd[AMP] is a source voltage of INV11 and INV12.

The input voltage Vinp branches before the stage of MUX11 and is inputted to a multiplexer MUX12 which introduces the input voltage to the first quantizing circuit Q1. An output of Q1 is inputted to INV12 through a capacitive coupling Cp1. The quantizing circuit Q1 converts Vinp into a binary number with a plurality of bits (four bits in the embodiment). The output voltages Vb0, Vb1, Vb2 and Vb3 are integrated by the capacitive coupling Cp1.

The capacitive coupling Cp1 includes capacitances Cb0, Cb1, Cb2 and Cb3. The output voltages Vb0 to Vb3 are inputted to Cb0 to Cb3, respectively. Outputs of cp1 and Cin12 are inputted to INV12 in parallel. Assuming that input and output voltages of INV12 to be V2 and V0, formula (2) is true.

$$Cf12(V0 - V2) = -\left\{ (V1 - V2)Cin12 + \sum_{i=0}^{3} (Vbi - V2)Cbi \right\} \quad (2)$$

The ratios of capacitances are in formulas (3-1) and (3-2).

$$Cin11:Cf11=1:1 \quad (3\text{-}1)$$

$Cin12:Cf12:Cb0:Cb1:Cb2:Cb3=16:1:1:2:4:8$  (3-2)

Vo can be obtained by formula (4) from formulas above.

$$V_0 = 16 \left\{ Vinp - \sum_{i=0}^{3} \frac{2^i Vbi}{16} \right\} \quad (4)$$

Formula (4) shows that Vinp is converted into a binary data of four bits, and the binary data is subtracted from Vinp itself. The output of quantizing circuit Q1 is upper four bits and Vo is lower bits. Vo is inputted to the second quantizing circuit Q2, and the second step of binarization is performed by four bits. The Q2 outputs binarized voltages of Va0, Va1, Va2 and Va3, which are the lower four bits data of Vinp.

Figure 2:
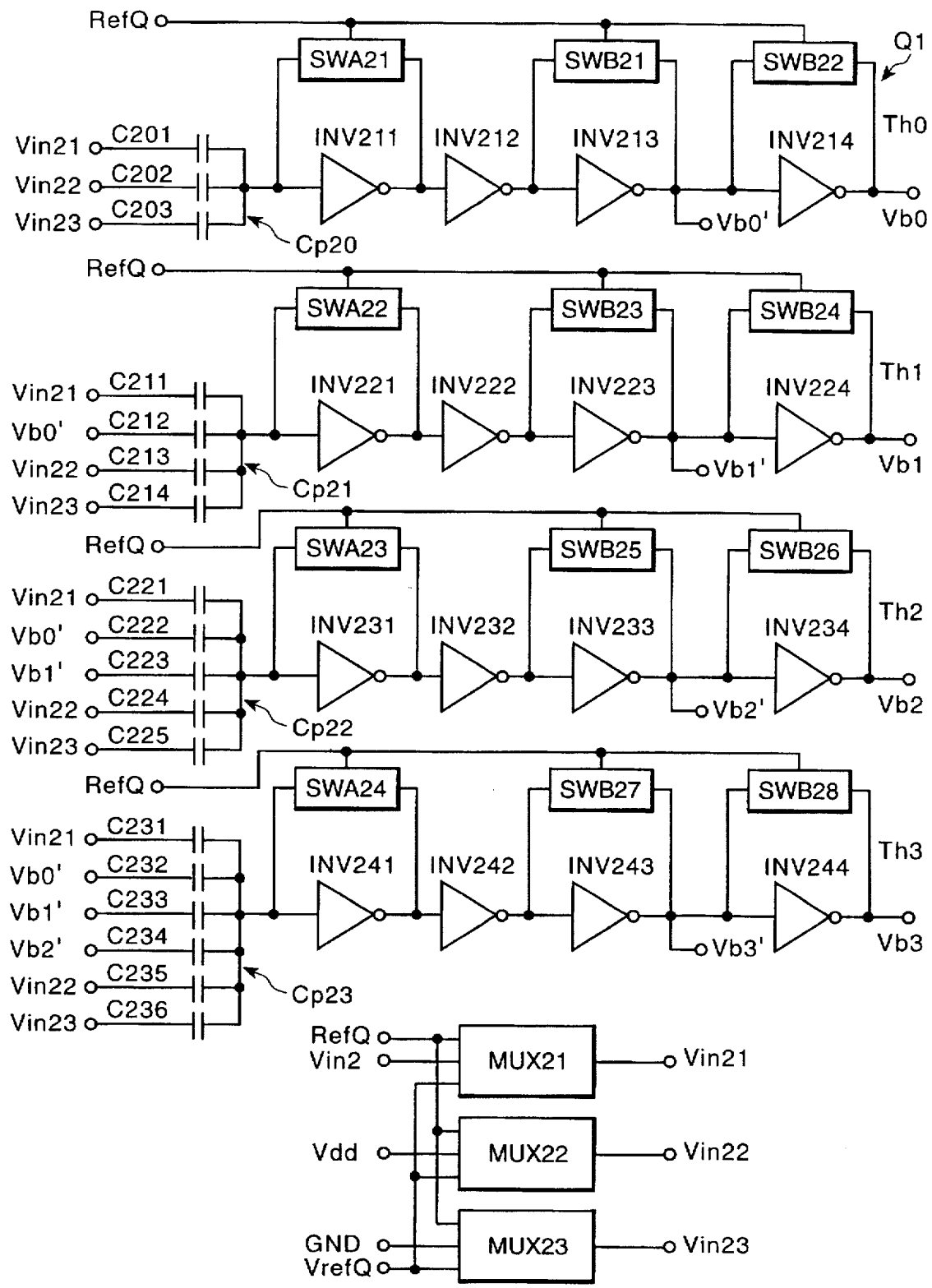
FIG. 2 shows a quantizing circuit in the embodiment.

In FIG. 2, the quantizing circuit Q1 includes thresholding circuits Th0, Th1, Th2 and Th3. The output voltages Vb0 to Vb3 are generated as outputs of the thresholding circuits. The inverted voltages Vb0' to Vb3' of the output voltages Vb0 to Vb3 are generated as intermediate data. An input to the quantizing circuit Q1 is generated by multiplexers MUX21, MUX22 and MUX23. MUX21 generates Vin21 by selectively outputting the input voltage Vin2 or the reference voltage VrefQ, and MUX22 generates Vin22 by selectively outputting the supply voltage Vdd or the reference voltages VrefQ. MUX23 generates Vin23 by selectively outputting a voltage of the ground GND or the reference voltage VrefQ.

Vin21, Vin22 and Vin23 are inputted to the upper-most thresholding circuit Th0, Vin21 to Vin23 and Vbo' are inputted to the second thresholding circuit Th1. Vin21 to Vin23, Vb0 and Vb1' are inputted to the third thresholding circuit Th2, and Vin21 to Vin23, Vb0', Vb1' and Vb2' are inputted to the fourth thresholding circuit Th3.

Thresholding circuit Th3 includes a capacitive coupling Cp23 and four stages of MOS inverters INV241, INV242, INV243 and INV244. Capacitive coupling Cp23 includes capacitances C231, C232, C233, C234, C235 and C236 to which Vin21, bo', b1', b2', Vin22 and Vin23 are connected, respectively.

Thresholding circuit Th2 includes a capacitive coupling Cp22 and four stages of MOS inverters INV231, INV232, INV233 and INV234. Capacitive coupling Cp22 includes capacitances C221, C222, C223, C224 and C225 to which Vin21, bo', b1', Vin22 and Vin23 are connected, respectively.

Thresholding circuit Th1 includes a capacitive coupling Cp21 and four stages of MOS inverters INV221, INV222, INV223 and INV224. Capacitive coupling Cp21 includes capacitances C221, C212, C213 and C214 to which Vin21, bo', Vin22 and Vin23 are connected, respectively.

Thresholding circuit Th0 includes a capacitive coupling Cp20 and four stages of MOS inverters INV211, INV212, INV213 and INV214. Capacitive coupling Cp20 includes capacitances C201, C202 and C203 to which by Vin21, Vin22 and Vin23 are connected, respectively.

The capacitance ratios of each capacitive coupling are shown in TABLE 1. TABLE 2 shows the changes of Vb0 to Vb3 when Vin21 is increases from 0 to Vdd[V]. Cu in TABLE 1 is a proportional constant, and Va in TABLE 2 means Vdd/16.

TABLE 1

CAPACITY OF CAPACITANCES

| CAPACITIVE COUPLING | CAPACITANCE | CAPACITY |
|---|---|---|
| CP20 | C201 | 16 Cu |
|  | C202 | 8 Cu |

TABLE 1-continued

CAPACITY OF CAPACITANCES

| CAPACITIVE COUPLING | CAPACITANCE | CAPACITY |
|---|---|---|
|  | C203 | 8 Cu |
| CP21 | C211 | 16 Cu |
|  | C212 | 8 Cu |
|  | C213 | 4 Cu |
|  | C214 | 4 Cu |
| CP22 | C221 | 16 Cu |
|  | C222 | 8 Cu |
|  | C223 | 4 Cu |
|  | C224 | 2 Cu |
|  | C225 | 2 Cu |
| CP23 | C231 | 16 Cu |
|  | C232 | 8 Cu |
|  | C233 | 4 Cu |
|  | C234 | 2 Cu |
|  | C235 | 1 Cu |
|  | C236 | 1 Cu |

TABLE 2

INPUT AND OUTPUT OF A/D CONVERTING CIRCUIT

| ANALOG INPUT VOLTAGE | INNER INTERMEDIATE OUTPUT | | | | OUTPUT VOLTAGE | | | |
|---|---|---|---|---|---|---|---|---|
| Vinp | Vb3' | Vb2' | Vb1' | Vb0' | Vb3 | Vb2 | Vb1 | Vb0 |
| 0 ≤ Vinp < Va | Vdd | Vdd | Vdd | Vdd | 0 | 0 | 0 | 0 |
| Va ≤ Vinp < 2Va | 0 | Vdd | Vdd | Vdd | 1 | 0 | 0 | 0 |
| 2Va ≤ Vinp < 3Va | Vdd | 0 | Vdd | Vdd | 0 | 1 | 0 | 0 |
| 3Va ≤ Vinp < 4Va | 0 | 0 | Vdd | Vdd | 1 | 1 | 0 | 0 |
| 4Va ≤ Vinp < 5Va | Vdd | Vdd | 0 | Vdd | 0 | 0 | 1 | 0 |
| 5Va ≤ Vinp < 6Va | 0 | Vdd | 0 | Vdd | 1 | 0 | 1 | 0 |
| 6Va ≤ Vinp < 7Va | Vdd | 0 | 0 | Vdd | 0 | 1 | 1 | 0 |
| 7Va ≤ Vinp < 8Va | 0 | 0 | 0 | Vdd | 1 | 1 | 1 | 0 |
| 8Va ≤ Vinp < 9Va | Vdd | Vdd | Vdd | 0 | 0 | 0 | 0 | 1 |
| 9Va ≤ Vinp < 10Va | 0 | Vdd | Vdd | 0 | 1 | 0 | 0 | 1 |
| 10Va ≤ Vinp < 11Va | Vdd | 0 | Vdd | 0 | 0 | 1 | 0 | 1 |
| 11Va ≤ Vinp < 12Va | 0 | 0 | Vdd | 0 | 1 | 1 | 0 | 1 |
| 12Va ≤ Vinp < 13Va | Vdd | Vdd | 0 | 0 | 0 | 0 | 1 | 1 |
| 13Va ≤ Vinp < 14Va | 0 | Vdd | 0 | 0 | 1 | 0 | 1 | 1 |
| 14Va ≤ Vinp < 15Va | Vdd | 0 | 0 | 0 | 0 | 1 | 1 | 1 |
| 15Va ≤ Vinp < 16Va | 0 | 0 | 0 | 0 | 1 | 1 | 1 | 1 |

The output Vb0 to Vb3 are generated by the quantizing circuit Q1 above. As the structure of Q2 is the same as Q1, the description is omitted. The lower four bits are generated by the quantizing circuit Q2 which is the next stage to Q1, therefore, the accuracy of the output is 16 times better than the performance completed by only Q1. Further accurate digital output can be generated by setting more steps of quantizing circuits.

As is clear from TABLE 1, the total of the capacities of the capacitances of each capacitive coupling is constant as 32Cu. It is possible to substantially reduce the influence of parasitic capacity of inverters INV211 to INV214, INV221 to INV224, INV231 to INV234, INV241 to INV244 by the above circuit. The formula (5) below is true, assuming that parasitic capacities of the inverter at the source side, at the ground side and at the output side to be Cpa1, Cpa2 and Cpa3, respectively, that capacities of capacitances of capacitive couplings connected the inverters to be W1 to Wn, that input voltages to the capacitances to be V1 to Vn, and that input voltage of the inverter to be VA, when the parasitic capacities are much smaller than W1 to Wn, $$VA = \frac{\sum_{i=1}^{n} WiVi + Cpa1Vdd + Cpa2 \times 0 + Cpa3 \times 0}{\sum_{i=1}^{n} Wi + Cpa1 + Cpa2 + Cpa3} \cong \qquad (5)$$

$$\frac{W1V1 + \sum_{i=2}^{n} WiVdd}{\sum_{i=1}^{n} Wi + Cpa1 + Cpa2 + Cpa3}$$

As the parasitic capacities are substantially constant, the influence of parasitic capacities can be ignored when the total capacity of the capacitive coupling is constant.

As above, an A/D converting circuit accurately converts data from analog to digital by two stages of quantizing circuits Q1 and Q2. In the present embodiment, it is further settled that offsets of the inverters INV211, INV221, INV231 and INV241 of the quantizing circuits Q1 and Q2 are canceled and the performances of the quantizing circuits are within the linear areas of INV11 and INV12.

First, for canceling the offset, the reference voltage VrefQ accurately generated outside of LSI for refreshing is inputted to each thresholding circuit. Each of the inputs and outputs of inverters INV211, INV213, INV214, INV221, INV223, INV224, INV231, INV233, INV234, INV241, INV243, INV244 are connected by switches SWA21, SWB21, SWB22, SWA22, SWB23, SWB24, SWA23, SWB25, SWB26, SWA24, SWB27, SWB28, respectively. The inputs and outputs of the inverters are short-circuited by the switches when refreshed.

Assuming that the thresholding voltage of each inverter to be Vth, the electric charge q0 generated in each capacitive coupling during refreshing is expressed by formula (6).

$$Q0 = 32Cu(VrefQ-Vth) \qquad (6)$$

When the thresholds voltages causing output inversion are Vth0, Vth1, Vth2 and Vth3 of the thresholding circuits Th0 to Th3, the thresholds can be calculated by formulas (7) to (10).

$$Vth0 = \frac{1}{16}(-8Vdd + 32Vth + q0) \qquad (7)$$

$$Vth1 = \frac{1}{16}(-8Vb0 - 4Vdd + 32Vth + q0) \qquad (8)$$

$$Vth2 = \frac{1}{16}(-8Vb1 - 4Vb0 - 2Vdd + 32Vth + q0) \qquad (9)$$

$$Vth3 = \frac{1}{16}(-8Vb2 - 4Vb1 - 2Vb0 - Vdd + 32Vth + q0) \qquad (10)$$

Here substituting formula (6) for q0 in formula (7), VrefQ can obtained by formula (11). Vth is canceled in the formula (11). It means that the dispersion of Vth, that is, offset is canceled.

$$VrefQ = \frac{2Vth0 + Vdd}{4} \qquad (11)$$

When Vth0 is 2.5[V], VrefQ is 2.0[V] by settling Vdd is 3.0[V]. In this case, Vth=2.5[V] in other thresholding circuits.

Switches SW11 and SW12 are connected to the inverters INV11 and INV12 so as to short-circuit the input and output. When refreshed, these switches are closed and the reference voltage Vref is inputted to Cin11 by a multiplexer MUX11. Generally, in response to the input voltage Vinp, the following is defined, and formulas (12) and (13) can be obtained.

An electrical charge q1 is generated in a capacitances Cin11, an electrical charge q2 is generated in a paracitic coupling Cp1, an input voltages of INV11 and INV12 is Vb, an output voltage of INV11 is Vn and an output voltage of INV12 is Vout.

$$q1 = Cu(Vn-Vb) + Cu(Vinp-Vb) \qquad (12)$$

$$q2 = \{(Vout-Vb) + 16(Vn-Vb) + 8(Vb0-Vb) + 4(Vb1-Vb) + 2(Vb2-Vb) + (Vb3-Vb)\}Cu \qquad (13)$$

Deleting Vn from the formulas (12) and (13), Vout can be expressed by formula (14).

$$Vout = 16Vinp - 8Vb0 - 4Vb1 - 2Vb2 - Vb3 - \frac{16q1}{Cu} + \frac{q2}{Cu} \qquad (14)$$

The function of an inverter starts from a little higher voltage (1.0[V], for example) than 0[V] by intentionally giving an offset Vx to an input voltage. Using the Vx, formula (14) can be rewritten into formula (15).

$$Vout = 16(Vinp - Vx) - 8Vb0 - 4Vb1 - 2Vb2 - Vb3 - \qquad (15)$$

$$\frac{16q1}{Cu} + \frac{q2}{Cu} + 16Vx$$

Three terms in the right side of formula (15) are the shifted voltages Vsft. It is the offset of the function under output voltage Vout. The formula (16) expresses the Vsft.

$$Vsft = -\frac{16q1}{Cu} + \frac{q2}{Cu} + 16Vx \qquad (16)$$

When the supply voltages of INV11 and INV12 are 5.0[V] which is higher than Vdd of the supply voltage of an inverter of a quantizing circuit, formulas (17) and (18) are true.

$$Cu(Vref-Vb) = q1 \qquad (17)$$

$$15Cu(Vth-Vb) = q2 \qquad (18)$$

When the formula (16) is substituted with formulas (17) and (18), Vref can be expressed by the formula (19).

$$Vref = \frac{1}{16}(15Vth + Vb + 16Vx - Vsft) \qquad (19)$$

It is possible to settle the all range of the input voltage Vinp within the linear area of INV11 and INV12 by settling higher the source voltage of INV11 and INV12 than the source voltage of the inverters of Q1 and Q2, and by giving Vx. Consequently A/D conversion can be more accurate. For example, input voltage is 1.0 to 4.0[V], and accordingly Vx=1.0[V]. In formula (11), the threshold value of Th0 to Th3 is settled as 2.5[V] which is 1.0[V] higher than Vth corresponding to that the upper limit of the function is settled as 4.0[V] which is 1.0[V] higher than Vdd. Vb=2.5 [V] and Vth=1.5[V]. It is settled that Vsft=1.0[V]. When formula (19) is substituted with them, Vref=2.5[V] can be obtained.

As above, A/D conversion can be more accurate by canceling offset by impressing the reference voltage during refreshing, and by settling the range of the function within linear area.

Figure 3:
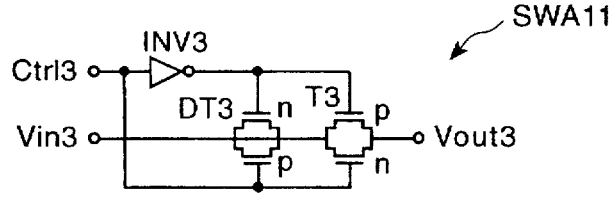
FIG. 3 shows a circuit of the first switch used in the embodiment.

In the FIG. 3, the switch SWA11 includes a transistor circuit T3 which has a pMOS transistor and a nMOS transistor parallel to the input voltage Vin3. The pMOS and nMOS are connected so that their sources are connected to the drain of the others. The input voltage Vin3 is connected to the drain of pMOS (that is the source of nMOS). A dummy transistor is connected to the input of the transistor circuit T3. The nMOS and pMOS are connected to T3 with inverse polarity, and their input and output are connected to each other. Control signal Ctrl3 is inputted to the gate of nMOS of T3, and the signal Ctrl3 is inverted by an inverter INV3 is inputted to the gate of pMOS. With respect to DT3, Ctrl3 is inputted to the gate of pMOS, and an inverted signal is inputted to the gate of nMOS.

This is the well-known MOS switch. Canceling the offset of input by DT3, Vin3 is outputted as an output voltage Vout3 or cuts off. As the switches SWA22, SWA23, SWA24, SW11 and SW12 have the same structure, the description is omitted.

Figure 4:
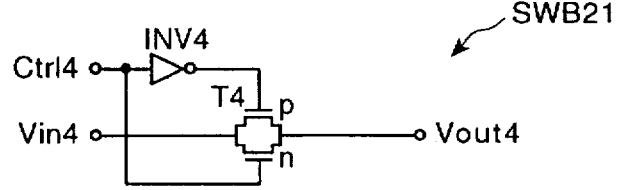
FIG. 4 shows a circuit of the second switch used in the embodiment.

In FIG. 4, the structure of a switch SWB21 is that omitted the dummy transistor from the structure of the MOS switch in FIG. 3. It includes a transistor circuit T4 and an inverter INV4. The switch outputs an input voltage Vin4 as an output voltage Vout4, or cuts off by a control signal Ctrl4. As the switches SWB22, SWB23, SWB24, SWB25, SWB26, SWB27 and SWB28 have the same structure, the description is omitted.

Figure 5:
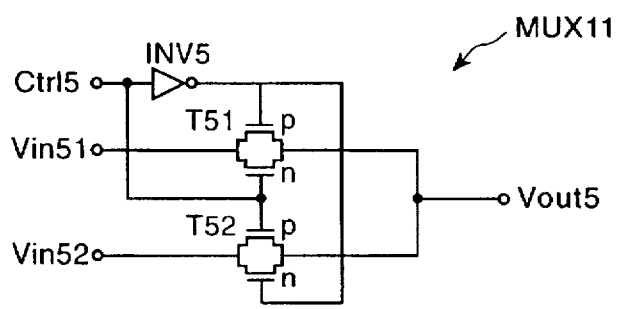
FIG. 5 shows a circuit of the multiplexer used in the embodiment.

In FIG. 5, a multiplexer MUX11 includes a pair of transistor circuits T51 and T52 including pMOS transistor and nMOS transistor parallel to an input voltage Vin5. In pMOS and nMOS of each transistor circuit are connected so that their sources are connected to the drain of the other parties. An input voltage Vin5 is connected to the drain of pMOS (that is the source of nMOS). A control signal Ctrl5 is inputted to the gates of nMOS of T51 and of pMOS of T52, and an inverse signal of Ctrl5 inverted by a inverter INV5 is inputted to the gates of pMOS of T51 and of nMOS of T52. This circuit is also well-known, which outputs Vin5 as an output voltage Vout5, or cuts off. The multiplexers MUX12, MUX21, MUX22 and MUX23 have the same structures, the description is omitted.

In an A/D converting circuit according to the present invention, the initial electric charge is given to a capacitive coupling of outputting in a quantizing circuit so as to cancel the dispersion of thresholds of MOS inverter in the quantizing circuit, the supply voltage of the first and the second inverters is made higher than the supply voltage of an inverter for quantizing, as well as the initial electric charge is given to a capacitance for input in order to limit the function of the quantizing circuit within the linear area of the first and the second inverters. Therefore, it is possible to cancel the influence of a threshold of an inverter, and also possible to improve the linearity of the inverter. Consequently, the accuracy of an output can be improved.

What is claimed is:

1. An A/D converting circuit comprising:

i) a first capacitance to which an analog input voltage is inputted;

ii) a first MOS inverter circuit connected to an output of said first capacitance, with linear relationship between input and output;

iii) a first quantizing circuit to which said analog input voltage is inputted for outputting an quantized output of said analog input voltage, said first quantizing circuits comprising a plurality of stages of thresholding circuits each of which comprises a MOS inverter for quantizing having a predetermined threshold and a capacitive coupling for quantizing having a plurality of parallel capacitances connected to an input of said MOS inverter for quantizing, said capacitive coupling for quantizing receiving said input voltage and inverted output of upper thresholding circuits, said MOS inverter for quantizing in each thresholding circuits inverting an output of said capacitive coupling for quantizing when said output exceeds said threshold;

iv) a capacitive coupling for output to which outputs of said first MOS inverter and of said first quantizing circuit are inputted;

v) a second MOS inverter circuit inputted to which an output of said capacitive coupling for output is inputted, with substantially the same characteristics as said first MOS inverter circuit; and vi) a second quantizing circuit an output of said second MOS inverter is inputted for quantizing said output of said second MOS inverter, said second quantizing circuits comprising a plurality of stages of thresholding circuits each of which comprises of MOS inverter for quantizing having a predetermined threshold, and a capacitive coupling for quantizing having a plurality of parallel capacitances connected to an input of said MOS inverter for quantizing, said capacitive coupling for quantizing receiving said input voltage and inverted output of upper thresholding circuits, said MOS inverter for quantizing in each thresholding circuits inverting an output of said capacitive coupling for quantizing when said output exceeds said threshold.

characterized in that a supply voltages of said first and second MOS inverter circuits are settled higher than a supply voltage of said MOS inverter for quantizing.

2. An A/D converting circuit as claimed as in claim 1, further comprising a refreshing means for short-circuiting an input and output of said first and second MOS inverter circuits and said MOS inverter for quantizing, as well as for inputting a plus voltage substantially equal to said threshold of said MOS inverters to said capacitive coupling.

* * * * *